(12) United States Patent
Meagley et al.

(10) Patent No.: US 8,003,293 B2
(45) Date of Patent: Aug. 23, 2011

(54) PIXELATED PHOTORESISTS

(75) Inventors: Robert P. Meagley, Emeryville, CA (US); Michael D. Goodner, Hillsboro, OR (US); Bob E. Leet, Scottsdale, AZ (US); Michael L. McSwiney, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1148 days.

(21) Appl. No.: 10/956,284

(22) Filed: Sep. 30, 2004

(65) Prior Publication Data

US 2006/0068318 A1 Mar. 30, 2006

(51) Int. Cl.
*G03F 7/00* (2006.01)
*G03F 7/004* (2006.01)
*G03F 7/029* (2006.01)
*G03F 7/26* (2006.01)

(52) U.S. Cl. .............. 430/270.1; 430/311; 430/317; 430/331; 430/913; 430/914

(58) Field of Classification Search .............. None
See application file for complete search history.

(56) References Cited

U.S. PATENT DOCUMENTS 4,592,816 A * 6/1986 Emmons et al. ............ 204/478
5,196,098 A * 3/1993 Rodriguez et al. ......... 204/471
5,384,229 A * 1/1995 Pai et al. ................. 430/270.1
6,455,223 B1 * 9/2002 Hatakeyama et al. ..... 430/270.1

OTHER PUBLICATIONS

Advances in Resist Technology and Processing XI, SPIE Proceedings vol. 2195, (ed. Nalumasu. O), Mar. 1994.
Cram, D.J., "The Design of Molecular Hosts, Guests, and Their Complexes," Nobel Lecture, Dec. 8, 1995, Dept. of Chemistry and Biochemistry, Univeristy of California at Los Angeles.
Ganesan, R., "Photoresist for 157 nm Optical Lithography," 2003 Fall Semiester: Graduate Sutdent Seminar, Dept. of Chemistry,Korea Ddv. Insti. of Sci. and Tech. (3 pages).
Gonsalves, K.F., et al., "Organic-Inorganic Nanocomposites: Unique of Resists for Nanolithograpy," Adv. Mater. (May 2001) 13 (10): 703-714.
Huang, H, et al., "Water-soluble Shell Cross-linked Knedels (SCK): Amphiphilic Nanospheres Composed of Polystyrene and Polyacrylic Acit Domans," Dept. of Chemistry, Washington University, St. Louis, MO (1997) (3 pages).
Jones, R.L., et al., "Deprotection Volume Characteristics and Line Edge Morphology in Chemically Amplified Resists," 2004.
Kim, J. et al., "Control of Photogenerated Acid Diffusion and Evaporation by Copolymerization with a Basic Monomer," J. Vac. Sci. Technnol. B (1999) American Vacuum Society, 17 (5): 2097-2102.
Kern, D.P., et al., "Materials Issues in Nanolithography Lithography," TNT2003, Salamanca-Sapin (Sep. 15-19, 2003).

(Continued)

*Primary Examiner* — Amanda C. Walke
(74) *Attorney, Agent, or Firm* — Blakely, Sokoloff, Taylor & Zafman LLP (57) ABSTRACT

A deliberately engineered placement and size constraint (molecular weight distribution) of photoacid generators, solubility switches, photoimageable species, and quenchers forms individual pixels within a photoresist. Upon irradiation, a self-contained reaction occurs within each of the individual pixels that were irradiated to pattern the photoresist. These pixels may take on a variety of forms including a polymer chain, a bulky cluster, a micelle, or a micelle formed of several polymer chains. Furthermore, these pixels may be designed to self-assemble onto the substrate on which the photoresist is applied.

45 Claims, 12 Drawing Sheets

OTHER PUBLICATIONS

Meagley, R.P., et al., "Molecular Anisotropy in 157 nm Photoresist Materials," 3rd International Symposium on 157 nm Lithography, Antwerp, Belgium, Sep. 6, 2001.

Meagley, R.P., et al., "Molecular Anisotropy of NGL Photoresist," 1st International EUVL Symposium, Dallas, TX, Oct. 18, 2002.

Montague, M.F., et al., "Imaging Layers Based on Surface-Initiated Polymers," Dept. of Chem. Engineering, University of Wisconsin-Madison, SRC Program Review 2001.

Nalamasu, O., et al., "Single-Layer Resist Design for 193 nm Lithography," Magazine (1999) vol. 42, Issue 5.

Potnikov, S.V., et al., "Study of REsolution Limits Due to Intrinsic Bias in Chemically Amplified Photoresists," J. Vac. Sci. Technol. B (1999), 17 (6): 3335-3338.

Rice, B.J., et al., "Effects of Processing Parameters on Line Width Roughness", Proceedings of SPIE, vol. 5039 (2003), pp. 384-392.

Willson, et al., "Improvement of Post-Exposure Delay Stability in Alicyclic ArF Excimer Photoresists," Recent Progress in 193 nm Resist Materials Development (2004), 9 pages.

Wu, H., et al., "Incorporation of Polyhedral Oligosilsequioxane in Chemically Amplified Resists to Improve Their Reactive Ion Etching Resistance," J. Vac. Sci. Technol. B (2001), 19 (3): 851-855.

Wu, H., et al., "Novel CA Resists with Photoacid Generator in Polymer Chain," Proceedings in SPIE, vol. 4345 (2001), pp. 521-527.

Wu, H., et al., "Preparation of a Photoacid Generating Monomer and Its Application in Lithography," Adv. Funct. Mater. (2001) 11 (4): 271-276.

Yang, X.M., et al., "Guided Self-Assembly of Symmetric Diblock Copolymer Films on Chemically Nanopatterned Substrates," Macromolecules (2000) 33:9575-9582.

* cited by examiner

POSS

X = Switch
Q = Quencher
▱ = Photoimageable Species

PIXELATED PHOTORESISTS

BACKGROUND OF THE INVENTION

1. Field of the Invention

The present invention relates to the field of photolithography to form integrated circuits and more particularly to the field of photoresists used in photolithography.

2. Discussion of Related Art

Photolithography is used in the field of integrated circuit processing to form the patterns that will make up the features of an integrated circuit. A photoresist is employed as a sacrificial layer to transfer a pattern to the underlying substrate. This pattern may be used as a template for etching or implanting the substrate. Patterns are typically created in the photoresist by exposing the photoresist to radiation through a mask. The radiation may be visible light, ultraviolet light, deep ultraviolet light, and extreme ultraviolet (EUV) light, or an electron beam. In the case of a "direct write" electron beam, a mask is not necessary because the features may be drawn directly into the photoresist. Most photolithography is done using chemically amplified systems or nonchemically amplified systems (e.g. "i-line"). In the i-line method an additive in the photoresist becomes soluble in developer when irradiated and the additive also renders surrounding species soluble and thus the exposed photoresist may be removed by a developer. In the chemical amplification (CA) method the radiation applied to the photoresist causes the decomposition of a photo-acid generator (PAG) that causes the generation of a small amount of acid catalyst throughout the exposed resist. The acid in turn causes a cascade of chemical reactions either instantly or in a post-exposure bake that increase the solubility of the resist such that the resist may be removed by a developer. An advantage of using the CA method is that the chemical reactions are catalytic and therefore the acid is regenerated afterwards and may be reused, thereby decreasing the amount of radiation required for pattern formation in the resist and thus enabling the use of shorter wavelengths of light such as EUV that are produced by weaker light sources. The photoresist may be positive tone or negative tone. In a positive tone photoresist the area exposed to the radiation will define the area where the photoresist will be removed. In a negative tone photoresist the area that is not exposed to the radiation will define the area where the photoresist will be removed. The CA method may be used with either a positive tone photoresist or a negative tone photoresist.

As the scale of the dimensions of the structures formed by etching materials masked by photoresist materials are scaled down, the performance of the photoresist materials must increase. For one thing, critical dimension (CD) control must be increased. As dimensions of the structures are scaled down, the amount of permissible error in the critical dimensions of the structures decreases. Also, the line width roughness of the areas etched must be minimal to accommodate for smaller dimensions and improved device performance. The defectivity of the photoresists must also be minimized. Similarly, collapse of the photoresist must be minimized. Defectivity and collapse are believed to occur, in part, when the mixture of the photoresist components are not uniformly distributed which results in uneven performance within the photoresist and thus the photoresist may not be properly patterned. Each of these issues poses challenges to chemically amplified (CA) resists.

To deal with these issues in the past, the choice of photoacid generator (PAG), as well as control of polymer molecular weight, polymer primary structure, molecular weight distribution, polymer side groups's structure and as well as quencher and other additives' structures and these species' relative ratios, in addition to the solvent system, are used to modulate the resulting performance of the photoresist formulation. Many of these approaches address the issue of preventing the PAG from diffusing beyond the region irradiated to reduce line width roughness and improve CD control. Approaches that address controlling the diffusion of the PAG include using a bulky PAG such as triphenylsulfonium perfluorooctanyl sulfonate (PFOS) to create upon photolysis at the appropriate wavelength a bulky PAG that will diffuse only a short length. The minimization of the diffusion of the PAG has also been taken one step further by attaching the PAG to a side chain of the photoimageable species, such as a polymer. Preventing the diffusion of the photoacid has also been approached by attaching the quencher to the photoimageable species. The drawback to these approaches is that the components within the photoresist are still not evenly distributed and the resulting system's constituent species are not all the same size. The lack of even distribution and uniformity in the size of the components may cause the photoacid to diffuse too much or too little before it is scavenged by a quencher. This may reduce the photospeed of the photoresist, and cause line roughness and loss of CD control.

DETAILED DESCRIPTION OF THE PRESENT INVENTION

Described herein are several embodiments of pixelated photoresists and methods of using the pixelated photoresists. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

The performance and patterning quality of photoresists may be improved by placing the components of the photoresist in a deliberately engineered arrangement with respect to one another within individual photoresist units, or pixels. A photoresist formed of pixels, a "pixelated" photoresist, ensures that the components of the photoresist are uniformly distributed throughout the resist. Also, by forming the photoresist of specifically engineered pixels, each of the pixels containing the active components of the photoresist is of controlled size and symmetry. The control of the distribution of the components and the uniformity of the size and symmetry of the pixels may serve to optimize the performance of the photoresist. Furthermore, the components within each of the pixels may be arranged to optimize photospeed and to minimize diffusion of the photoacid once it is activated.

The main components of a photoresist are a photoacid generator (PAG), a photoimageable species (such as a polymer), a solubility switch to change the solubility of the photoimageable species when activated by the photo-generated acid produced by the photoacid generator, and a quencher to control the activity of the photo-generated acid. The deliberately engineered arrangement of the components places the PAG in close proximity to the switches on the photoimageable species and separates the quencher from the PAG by the photoimageable species. This arrangement ensures that the photospeed of the photoresist is maximized by positioning the PAG in close proximity to the switch on the photoimageable species and by ensuring that the quencher cannot come between the PAG and the switch to reduce the activity of the photogenerated acid before it can react with the switch. This arrangement also ensures that the photogenerated acid does not react with switches on photoimageable species that are beyond the region that has been addressed by radiation. This occurs by surrounding the engineered ensemble of the PAG, switch, and photoimageable species by quencher. Once the photogenerated acid reacts with the switch and deprotects the photoimageable species to thereby change the solubility of the photoimageable species, the photogenerated acid may be neutralized by the basic quencher positioned beyond the photoimageable species.

This deliberately engineered placement and size and symmetry constraint (molecular weight distribution) of the PAG, switch, photoimageable species, and quencher forms individual pixels within the photoresist within which a self-contained reaction occurs to pattern the photoresist. These pixels may take on a variety of forms including a polymer chain, a bulky cluster, a micelle, or a micelle formed of several polymer chains. Furthermore, these pixels may be designed to self-assemble onto the substrate on which the photoresist is formed.

Figure 1A:
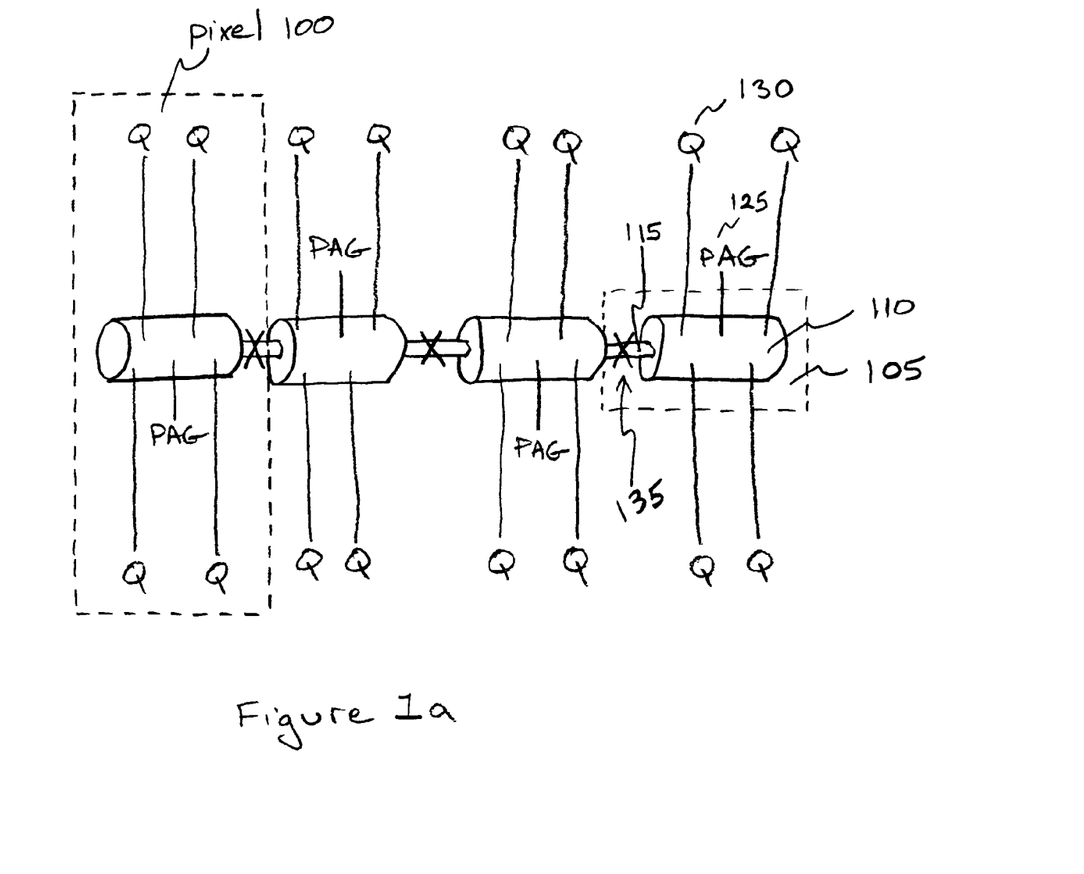
FIGS. 1a-1b illustrate polymer-chain embodiments of pixelated photoresists according to embodiments of the present invention.
Figure 1B:
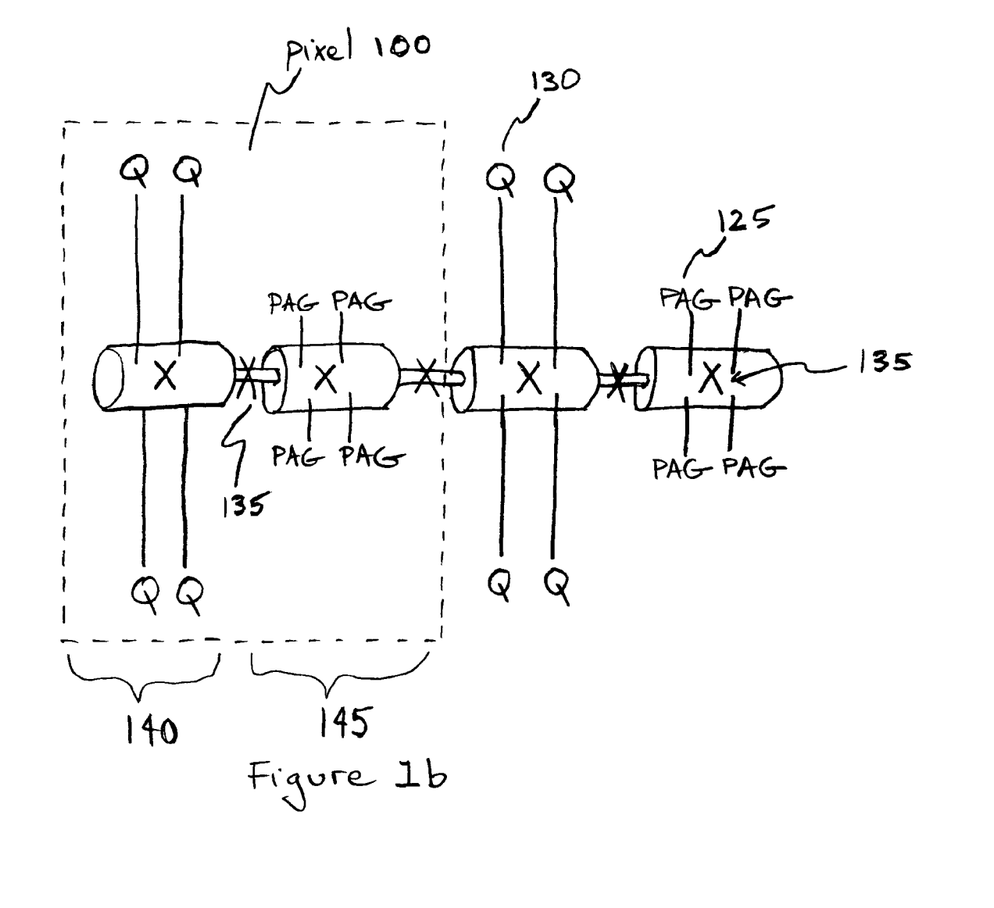

In one embodiment, the pixels may be formed by a polymer chain. The polymer chain may be designed to include individual pixels 100 that pre-organize the arrangement of a photoacid generator (PAG), a photoimageable species having a solubility switch, and a quencher with respect to one another. These individual units are arranged so that the irradiated portions of the polymer chain may break away from the unexposed portions of the chain and form distinct irradiated patterns within the photoresist. In an embodiment, the photoimageable species 105 may be the polymer backbone of the polymer chain as illustrated in FIG. 1a. The photoimageable species 105, in this embodiment, is a combination of a first polymer 110 and a linker species 115. The linker species may be a second polymer. The first polymer 110 has side-groups onto which one or more photoacid generators (PAG) 125 and quenchers 130 are connected. The first polymer 110 may be styrenic derivatives such as parahydroxystyrene, tBOC-styrene, styrene, acrylate copolymer (e.g. ESCAP photopolymer), acrylate or methacrylate polymers and copolymers, polycycloolefins (e.g. polynoborne derivatives, polysilsequioxanes, or polysiloxanes, or copolymers. The photoacid generators 125 are positioned closer to the first polymer 110 than the quenchers 130. The quenchers 130 are placed at a distance beyond the PAG 125 to surround the PAG 125 so that the photoacid may not diffuse beyond the boundary formed by the quenchers 130 and react with further switches beyond the irradiation portion of the photoresist after the PAG 125 is irradiated to form a photoacid that reacts with the switch 135. Side chains that may be used to bind the PAG 125 to the polymer chain include short hydrocarbon chains such as methylene, ethyl, propyl and other hydrocarbons like nobornyl, cyclohexyl and cyclopentyl groups, functionalized hydrocarbons such as glycol or hydroxyacetate. Side chains that may be used to bind the quenchers 130 to the polymer chain may be longer than the side chains used to bind the PAG 125 to the polymer chain. Side chains that may be used to bind the quencher to the polymer chain include hydrocarbon chains such as octyl groups, decyl groups, docecyl groups, and octadecyl groups, polyethyleneoxide (e.g. triethyleneoxide), oligonorbornyl, steroidal (e.g. suitably functionalized cholate, deoxycholate, lithocholate), oligonortricyclene, oligoacrylate, oligosiloxane, oligosilsesquioxane, and fluorocarbon telomers. The PAG 125 may be, for example, a di- or tri-aryliodonium, an arylsulfonium, a perflate, a nonaflate, or a hydrocarbon sulfonate. The quencher 130 may be a base such as tetrabutylammonium hydroxide, collidine, analine, or dimethylaminopyridine. The switch 135 may be a tertiary ester such as methylnorbornol carbosylate, t-butyl carboxylate, or t-butyl carbonate or methyl carbonate. The linker species 115 links the units of the first polymer 110 to one another and contains a solubility switch 135. The linker species 115 may be different types of polymers depending on the wavelength of the irradiation to which the photoresist is exposed. At 193 nm the linker species 115 may be a branched or straight hydrocarbon, a short polyether such as an oligomer of polyethyleneoxide, an oligomer of a polyester, an oligomer of a polyacrylate, or a fluorocarbon telomer. For irradiation in the EUV range, the second polymer may be, for example, an oligomer of polyhydroxystyrene, an oligomer of polystyrene, or an oligomer of polysiloxane. The second polymer may contain a solubility switch 135 that breaks the linker species 115 so that the irradiated portions of the photoresist break up into pieces that may be solvated by a developer solution. The solubility switch may also be placed on the first polymer 110, as illustrated in FIG. 1b. By placing the solubility switch 135 on the first polymer 110 the first polymer may be cleaved in half in the situation where only part of the first polymer 110 is irradiated. Placing the solubility switch 135 on the first polymer 110 may allow for further reduction of roughness and critical dimension control of the structures patterned by the photoresist because it allows for further precision in the portions of the photoresist that are rendered soluble upon irradiation. FIG. 1b further illustrates an alternate embodiment of a pixel 100 formed of polymer chain. In this embodiment, the individual pixels 100 are formed by two units of the first polymer 110. The first unit 140 of the first polymer 110 is bound to at least one quencher 130. The second unit 145 of the first polymer 110 is bound to at least one PAG 125. The quencher 130 on the first unit 140 is placed at a distance from the first polymer 110 that is greater than the distance that the PAG is placed from the first polymer 110. The first unit 140 and the second unit 145 are linked to one another by a linker containing a switch, and the pixels 100 are linked to one another by a linker containing a switch. This embodiment is an alternate design that may allow for the placement of several PAG's 125 or quenchers 130, as illustrated, to promote the cleavage of the polymer chain along any of the individual units formed of the first polymer 110 when a switch is part of the first polymer 110.

Figure 2A:
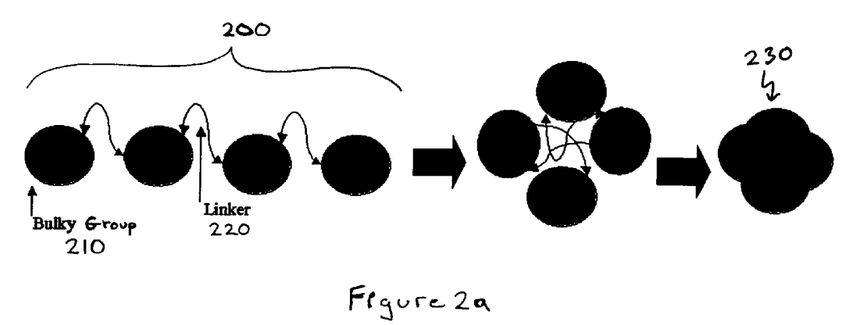
FIGS. 2a-2h illustrate self-assembling folded polymer chain embodiments of pixelated photoresists according to embodiments of the present invention.
Figure 2B:
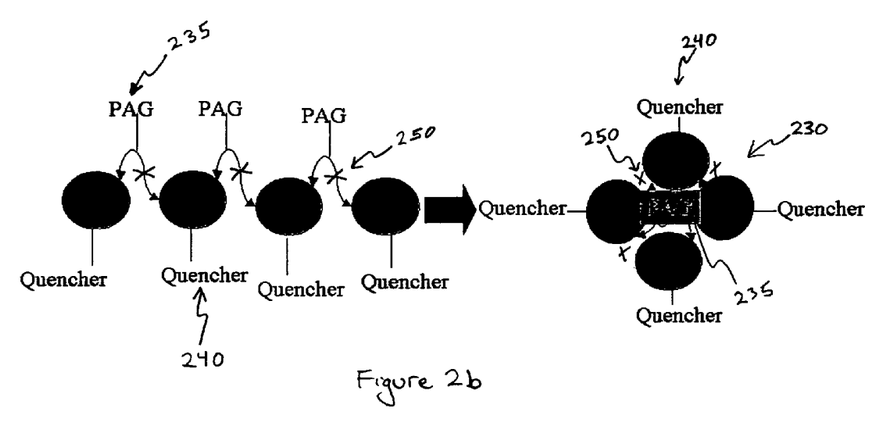
Figure 2C:
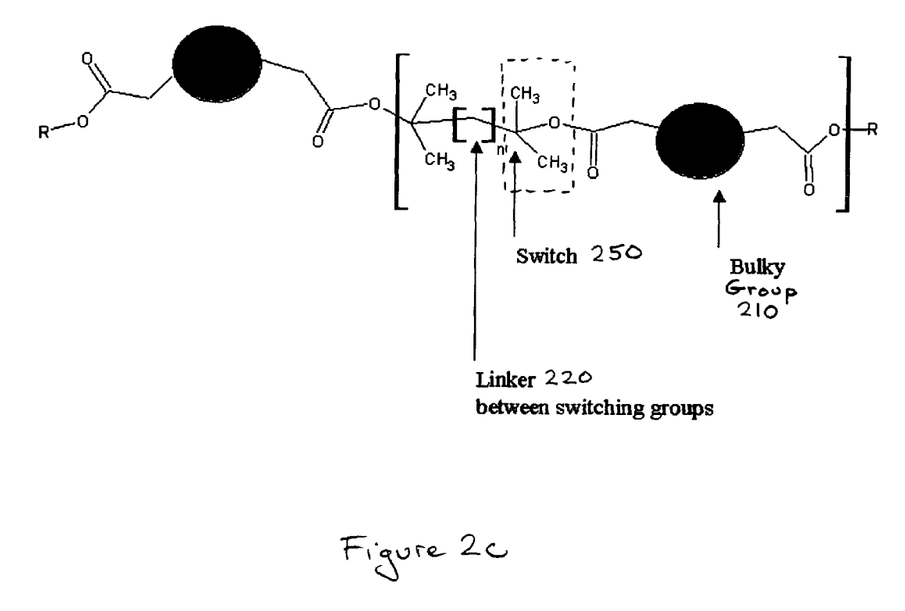
Figure 2D:
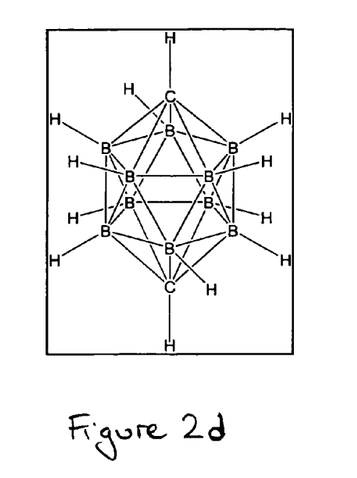
Figure 2E:
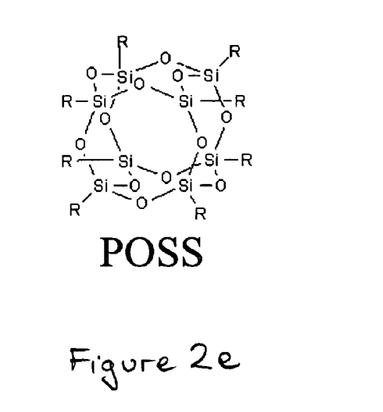
Figure 2F:
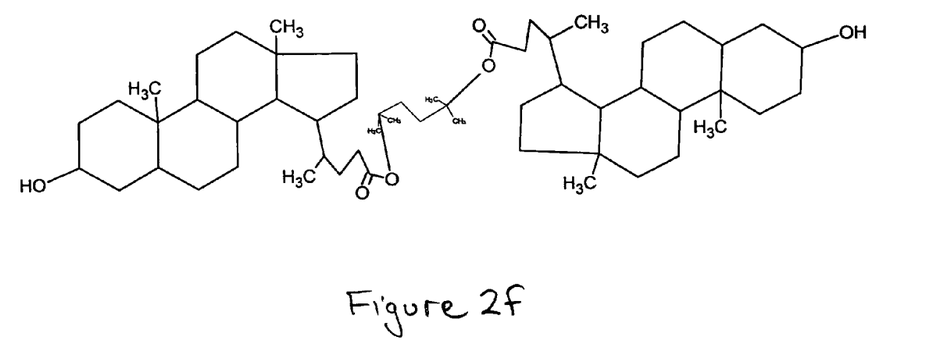
Figure 2G:
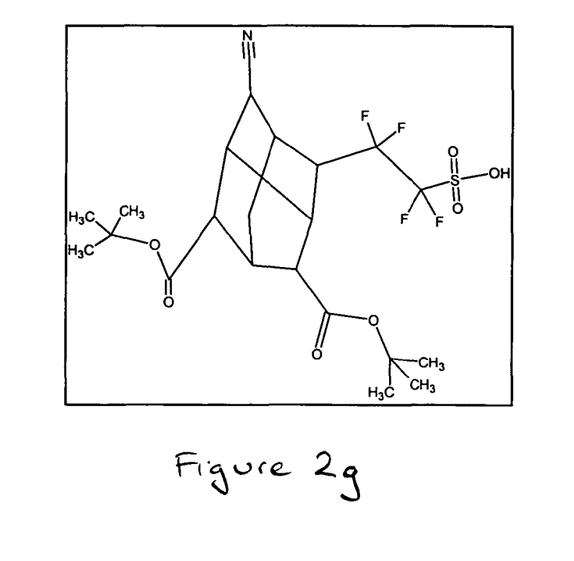
Figure 2H:
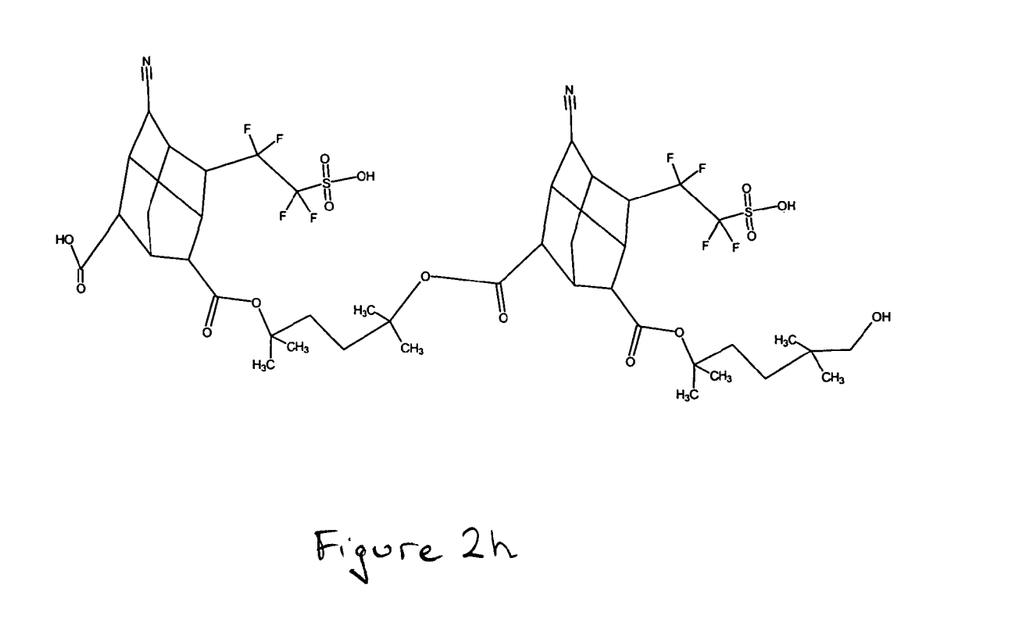

In another embodiment, the polymer chain may be designed to fold into bulky clusters that create individual pixels. The polymer chain in this embodiment folds by self-assembly into a bulky cluster. The self-assembly causes the bulky cluster to be uniformly packed so that the molecular weight distribution of the individual pixels as well as the photoresist as a whole are uniform and as well enforces specific geometry upon the bulky cluster. FIG. 2a illustrates a polymer chain 200 that is formed of bulky groups 210 that are connected to one another by linkers 220. The bulky group may be a carborane group as illustrated in FIG. 2d, polyhedral oligosilsequioxane (POSS) as illustrated in FIG. 2e, a steroid such as a cholate as illustrated in FIG. 2f, or an alicyclic hydrocarbon such as the adamantine-based compounds illustrated in FIGS. 2g and 2h. Additionally, inorganic clusters such as colloidal silica or carbon having a diameter of less than approximately 2 nm or micelles may be used as the bulky groups 210. The linker may be different types of polymers depending on the wavelength of the irradiation to which the photoresist is exposed. At 193 nm the linker may be a flexible branched hydrocarbon, a polyether such as polyethyleneoxide, a polyester, a polyacrylate, or an epoxide type polymer. For irradiation in the EUV range, the second polymer may be, for example, polyhydroxystyrene, polystyrene, or polysiloxane. As illustrated in FIG. 2a, the bulky groups 210 connected by the linkers 220 fold by self-assembly into the bulky cluster 230. The self-assembly may occur because of the steric hinderance created between the bulky groups 210, by attractive forces such as hydrogen bonding, hydrophobic forces and/or charge attraction. The bulky groups 210 want to be as far away from one another as possible and will thus push the relatively small linkers 220 into the center of the bulky cluster 230 and the bulky groups will be pushed to the outside of the bulky cluster 230. Surface energy mis-match between linker 220 and cluster 230 provide additional driving force for bulky cluster formation. Thus both entropic energy (steric reorganization) and enthalpic energy (binding of moieties through associative forces) drive the self assembly for bulky clusters (i.e. form nanodomains.) The steric hinderance between the bulky groups 210 also ensures that the similarly shaped and sized bulky groups 210 are spaced evenly apart within the bulky cluster and form a uniformly shaped bulky cluster. The bulky cluster 230 is the pixelated unit of this embodiment. In order to be a self-contained pixel of the photoresist, the bulky cluster is functionalized with at least one PAG 235, a quencher 240, and a switch 250, as illustrated in FIG. 2b. The PAG 235 and the switch 250 are positioned on the linkers so that they end up in the center of the bulky cluster 230. The PAG 235 may be, for example, a di- or tri-aryliodonium, an arylsulfonium, a perflate, a nonaflate, or a hydrocarbon sulfonate. The switch 250 may be a tertiary ester such as methylnorbornol carbosylate, t-butyl carboxylate, or t-butyl carbonate or methyl carbonate. The quencher 240 is positioned on the bulky groups 210 so that it is pushed to the outside of the bulk cluster and thereby surrounds the PAG groups 235. The quencher 240 may be a base such as tetrabutylammonium hydroxide, collidine, analine, or dimethylaminopyridine. When the bulky cluster 230 is irradiated the PAG groups 235 decompose and form a photo-generated acid that reacts with the switches 250 to change the solubility of the linker groups. Once the solubility of the linker groups is changed, the bulky cluster 230 may be broken apart and solvated by a developer. The photo-generated acid may not diffuse beyond the distance surrounded and enclosed by the quenchers 240. Because the diffusion of the photo-generated acid is limited to a region within the bulky cluster pixel, the irradiated portion of the photoresist is well controlled and ultimately line roughness and resolution of the structures patterned by the photoresist are improved. FIG. 2c illustrates an example of a portion of a chain used to form a bulky cluster. The switch in one embodiment may be dimethylcarbonol as illustrated in FIG. 2c. The linker illustrated in FIG. 2c is a hydrocarbon as well.

Figure 3A:
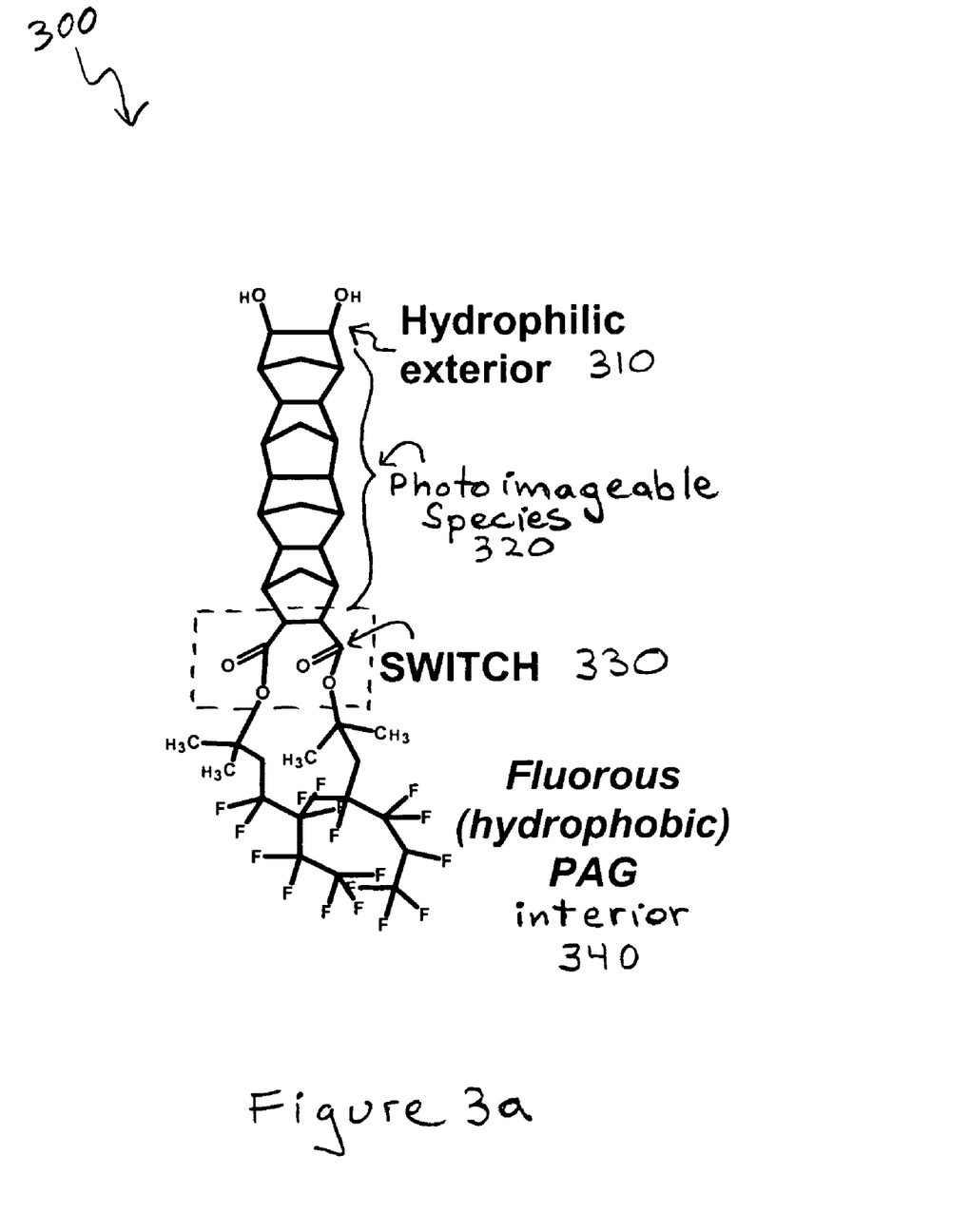
FIGS. 3a-3b illustrate a micellar embodiment of pixelated photoresists according to embodiments of the present invention.
Figure 3B:
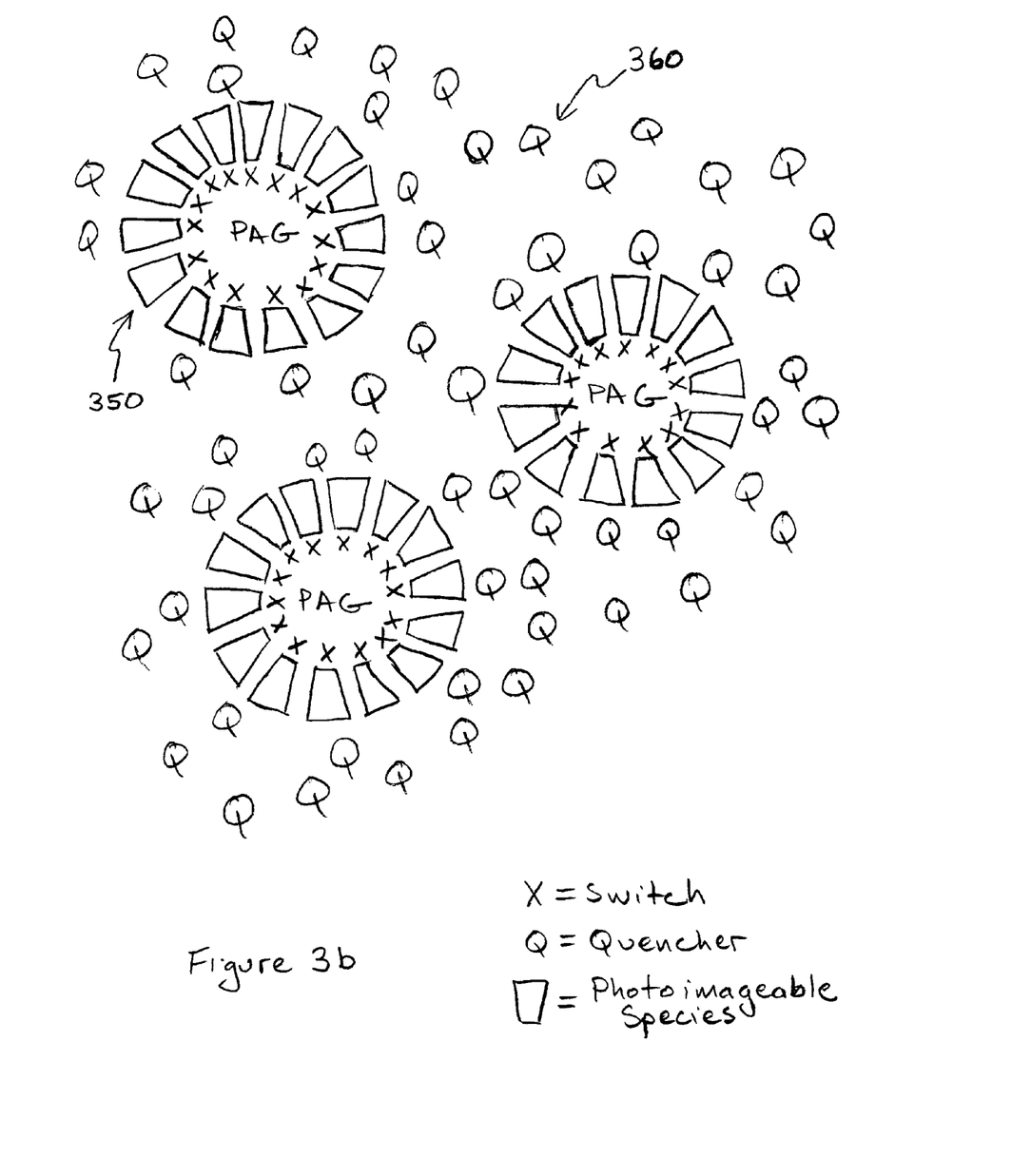

In another embodiment, the pixels are formed by a micelle. A micelle is a sphere-shaped complex formed of many individual units having a hydrophilic (water-loving) end and a hydrophobic (water-hating) end. The shape of micelles is due to energy-minimization and thus may be any shape that minimizes energy. The individual units may be formed of covalently bound compounds such as the one illustrated in FIG. 3a. FIG. 3a illustrates a covalently bound compound 300 having a hydrophilic exterior end 310, bulk portion formed of a photoimageable species 320, a solubility switch 330, and a hydrophobic PAG interior 340. In this embodiment the hydrophobic PAG interior 340 is fluorous, but it may be other PAG groups such as, for example, a di- or tri-aryliodonium, an arylsulfonium, a perfluorohydrocarbon sulfonate, a nonaflate, or a hydrocarbon sulfonate. When placed in an appropriate solvent the covalently bound compound 300 will form a micellar structure where the individual units 300 clump together to form sphere-like structures where the hydrophobic PAG interior 340 is in the center and the hydrophilic exterior 310 is on the outside of the micelle. A cross-sectional view of a micelle 350 is illustrated in FIG. 3b. The micelle 350 forms a pixel of the photoresist in combination with the quencher molecules 360 surrounding the micelles 350. The quencher 360 may be a base such as tetrabutylammonium hydroxide, collidine, analine, or dimethylaminopyridine. In an alternate embodiment the quencher 360 may be bound to the exterior of the micelle 350. Upon irradiation the PAG 340 forms a photo-generated acid that is hydrophilic and diffuses towards the exterior of the micelle. Due to this diffusion, the photo-generated acid will interact with several switches 330 to change the solubility of the photoimageable species 320. Upon further diffusion to the exterior of the micelle 350, the photo-generated acid will hit the quencher 360 that surrounds the micelle.

The micelle 350 just described in the above embodiment is a standard type of micelle having a hydrophobic interior and a hydrophilic exterior. The micelle 350 may alternatively be a reverse micelle having a hydrophilic interior and a hydrophobic exterior. A reverse micelle 350 may be formed of micellar units such as 300 in FIG. 3a where the PAG is hydrophilic and the opposite end of the micelle is hydrophobic such that when the micellar units 300 are dissolved in a non-polar solvent the hydrophilic PAG is in the center of the micelle 350 and the hydrophobic end is on the outside of the micelle 350. In another embodiment, the positions of the PAG's 340 may be reversed to the exterior of the micelle 350 by solvating a micellar unit 300 having a hydrophobic PAG 340 within an aqueous or polar solvent or by solvating micellar units 300 having a hydrophilic PAG in a non-aqueous non-polar solvent. In this embodiment, in a positive tone photoresist, where the PAG is on the outside of the micelle 350, upon irradiation the photo-generated acid will diffuse into the center of the micelle and will react with the switch 330 to change the solubility of the photoimageable species 320 so that it may be removed by a developer. In another embodiment, in a negative tone photoresist, the PAG on the outside of the micelle may act to link the micelle to other micelles to turn the irradiated portions of the photoresist into insoluble portions that would not be removed by a developer solution. The quencher 360 that surrounds the micelles 350 may then quench the photo-generated acid and prevent it from diffusing beyond the region of the micellar pixel. The components of the micelle 350 may be formed by ionic forces between the photoacid generator, the photoimageable species, and the quencher. The micelle may also be formed by polymer chains where the photoacid generator, the photoimageable species, and the quencher are covalently bound to one another, as illustrated in FIG. 3a. Alternatively, the micelle may be formed by a combination of ionic forces and covalent bonds between the respective components of the photoresist. The micelle 350 may also be engineered to easily coat substrates on which the photoresist is coated and to encourage adhesion of the micelle to the substrate. This may be done by adding triethylsiloxy groups, azo groups, olefin groups, or phosphate groups to the outside of the micelle 350 depending on the type of substrate used. For example, the olefin groups may increase adhesion and coating of silicon surfaces, triethylsiloxy groups may increase adhesion and coating of silicon dioxide surfaces, titanium surfaces, and aluminum surfaces, and thiols may increase the adhesion and coating of the photoresist on gold and copper surfaces. The micelle 350 may also be engineered to resist clumping together with other micelles by adding, for example, hydrocarbon chains, short styrene chains, or a dimethyloxylate chain to aromatic based micelles.

Pixelated photoresists may be used to create patterns for the formation of many structures used in integrated circuits. In one embodiment, a chemically amplified pixelated photoresist may be used to form lines for transistor gates. In another embodiment, a chemically amplified pixelated photoresist may be used to form trenches or vias for interconnect lines. In one embodiment the chemically amplified pixelated photoresists may be used to form both vias and trenches by a conventional dual damascene method. Other applications for forming microelectromechanical machines (MEMS), microfluidics structures, or other small structures are also comprehended. For the sake of simplicity a process of forming only vias will be described.

Figure 4A:
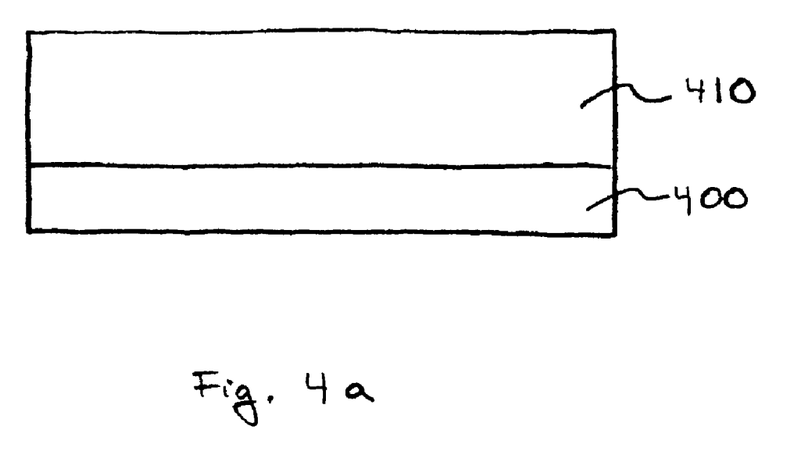
FIGS. 4a-4i illustrate a dual damascene method of forming interconnect lines incorporating pixelated photoresists according to an embodiment of the present invention.

In FIG. 4a, substrate 400 is provided. Substrate 400 may be any surface generated when making an integrated circuit upon which a conductive layer may be formed. In this particular embodiment the substrate 400 may be a semiconductor such as silicon, germanium, gallium arsenide, silicon-on-insulator or silicon on sapphire. A dielectric layer 410 is formed on top of substrate 400. Dielectric layer 410 may be an inorganic material such as silicon dioxide or carbon doped oxide (CDO) or a polymeric low dielectric constant material such as poly(norbornene) such as those sold under the tradename UNITY™, distributed by Promerus, LLC; polyarylene-based dielectrics such as those sold under the tradenames "SiLK™" and "GX-3™", distributed by Dow Chemical Corporation and Honeywell Corporation, respectively; and poly(aryl ether)-based materials such as that sold under the tradename "FLARE™" distributed by Honeywell Corporation. The dielectric layer 410 may have a thickness in the approximate range of 2,000 and 20,000 angstroms.

Figure 4B:
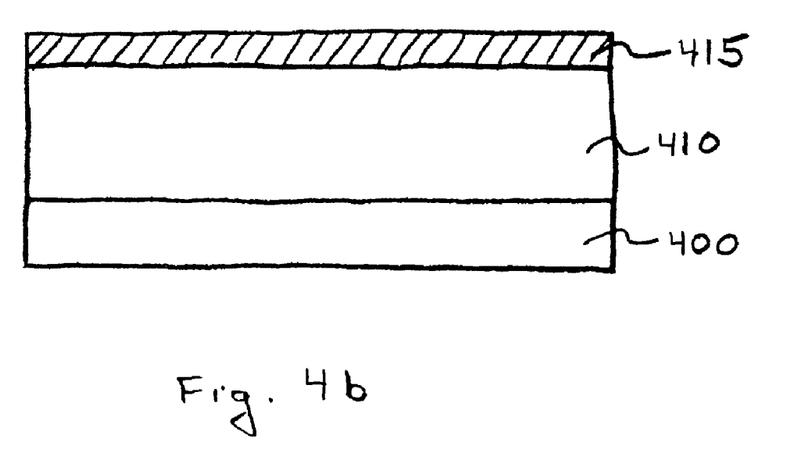

In FIG. 4b, after forming the dielectric layer 410, a bottom anti-reflective coating (BARC) 415 may be formed over the dielectric layer 410. In embodiments where non-light lithography radiation is used a BARC 415 may not be necessary. The BARC 415 is formed from an anti-reflective material that includes a radiation absorbing additive, typically in the form of a dye. The BARC 415 may serve to minimize or eliminate any coherent light from re-entering the photoresist 420, that is formed over the BARC 415 in FIG. 4c, during irradiation and patterning of the photoresist 420. The BARC 415 may be formed of a base material and an absorbant dye or pigment. In one embodiment, the base material may be an organic material, such as a polymer, capable of being patterned by etching or by irradiation and developing, like a photoresist. In another embodiment, the BARC 415 base material may be an inorganic material such as silicon dioxide, silicon nitride, and silicon oxynitride. The dye may be an organic or inorganic dye that absorbs light that is used during the exposure step of the photolithographic process.

Figure 4C:
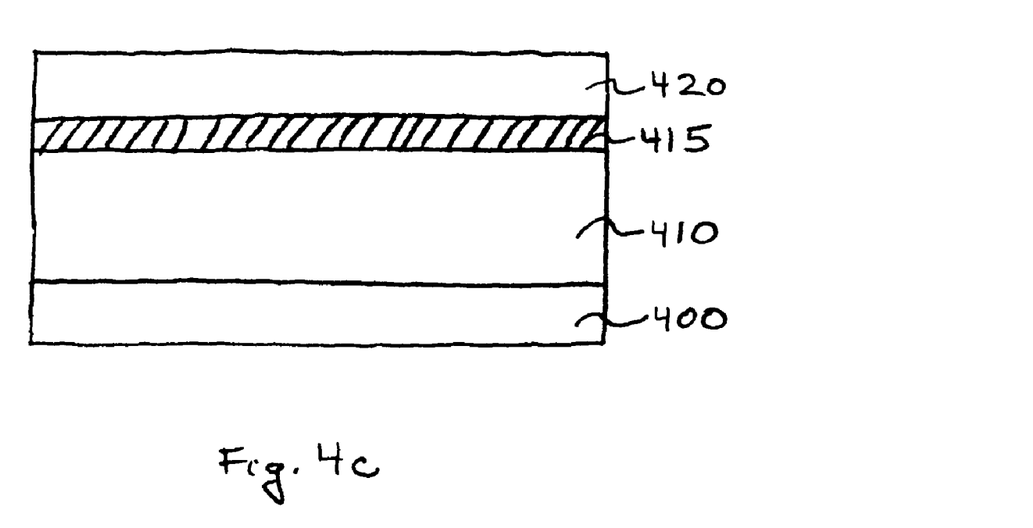

In FIG. 4c a pixelated photoresist 420, such as those described above, is formed over the BARC 415. The pixelated energy photoresist 420 may be positive tone or negative tone. In a positive tone photoresist the area exposed to the radiation will define the area where the photoresist will be removed. In a negative tone photoresist the area that is not exposed to the radiation will define the area where the photoresist will be removed. The pixelated photoresist 420, in this particular embodiment, is a positive resist. The pixelated photoresist 420 may have a thickness sufficient to serve as a mask during an etching or implantation step. For example, the pixelated photoresist 420 may have a thickness in the approximate range of 500 angstroms and 2500 angstroms. In general, for implant purposes the pixelated photoresist 420 will be thickest, for contact patterning the pixelated photoresist 420 will be thinner than for implant purposes, and the pixelated photoresist 420 will be thinnest for gate patterning.

The pixelated photoresist 420 contains pixels as described above that may be in the form of polymer chains, bulky clusters, or micelles. These pixels each contain a PAG, a photoimageable species having a solubility switch, and a quencher. The pixelated photoresist 420 is formed by solvating the pixels or pixel components within a compatible solvent and by optionally adding additives. The ratio of PAG/photoimageable species/quencher may be in the approximate range of 1/10/1 and 1/100/3. The additives in the photoresist 420 may be any one of or a combination of a plasticizer, a surfactant, adhesion promoter, an acid amplifier, a dissolution inhibitor, a dissolution promoter, a photobase, or a photodecomposable base. The pixels and the additives of the photoresist 420 are mixed with a solvent. The solvent may be non-aqueous, for example, polypropylene glycol monomethyl ether acetate (PGMEA), ethyl lactate, cyclopentanone, heptanone, or cyclohexanone. The solvent, in the situation where the pixels of the photoresist 420 are regular micelles having a hydrophilic surface are solvated, may be polar and/or an aqueous solvent. Examples of polar solvents include alcohols such as butanol, ethanol, and isopropanol, acetone, and water. In another example, water may be used as a polar solvent. An aqueous solvent may be valuable in that water is more environmentally safe than most organic solvents. The choice of solvent depends on the polarity and architecture of the components used to form the photoresist. The amount of solvent is also dependent on the thickness of the photoresist and on the size of the wafer. If a thicker pixelated photoresist 420 is desired then less solvent is used, and if a thinner pixelated photoresist 420 is desired more solvent is used. Also, the larger the wafer the more solvent is used. In a particular embodiment, for the pixelated photoresist 420 used for 248 nm, 193 nm, and EUV (in particular 13.5 nm) the amount of solvent used may be in the approximate range of 1% to 5% by weight solid of the pixelated photoresist 420.

Figure 4D:
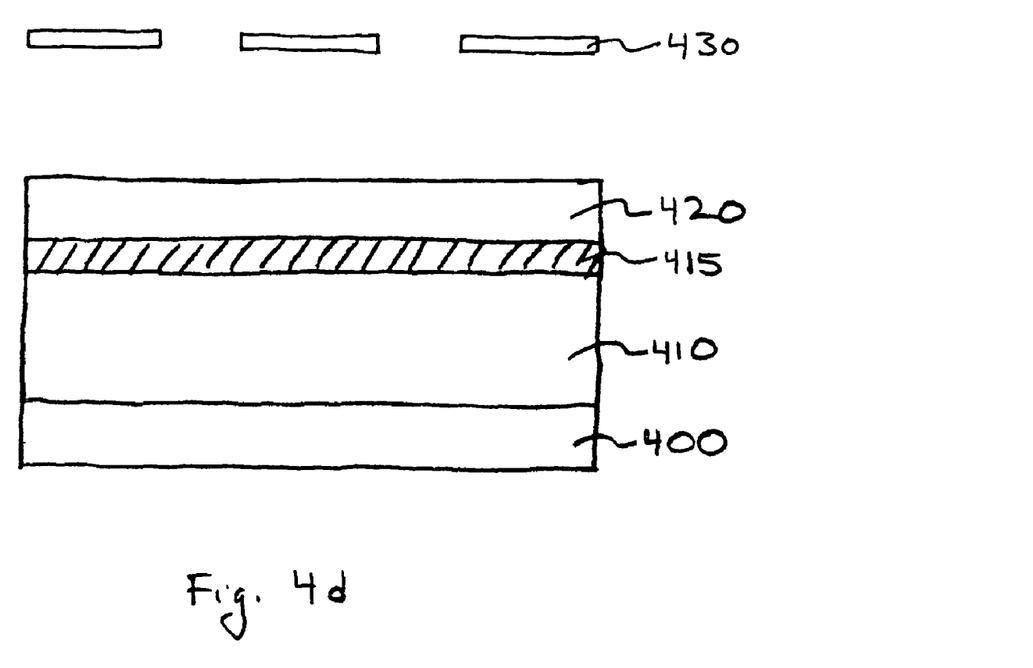
Figure 4E:
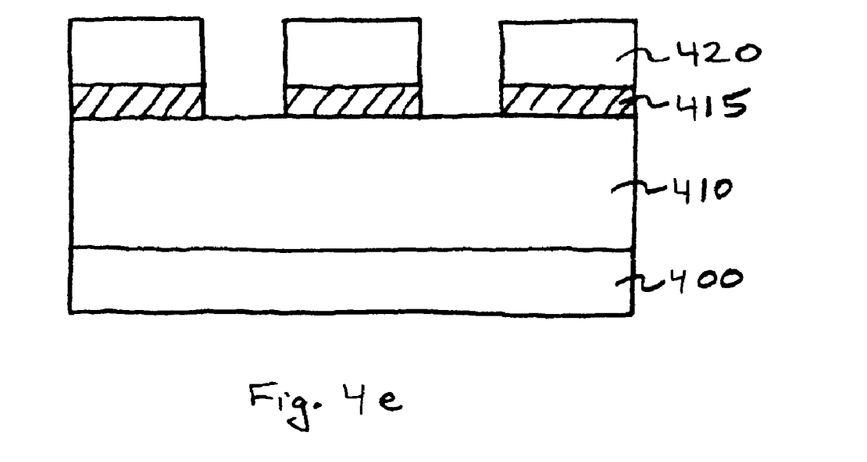

As illustrated in FIG. 4d, a mask 430 is formed over the photoresist 420. In FIG. 4e, the photoresist 420 and the BARC 415 are patterned by exposing the masked layer to radiation. The radiation may be 193 nm, 157 nm, deep ultraviolet (DUV), extreme ultraviolet (EUV), electron beam projection, or ion beam lithographic technologies. In one particular embodiment, the irradiation used to pattern the photoresist 420 may be EUV having a wavelength of 13.5 nm. Upon irradiation, the PAG within the irradiated pixels of the pixelated photoresist 420 dissociates to form a photo-generated acid. The photo-generated acid may serve as a catalyst to deprotect and to change the solubility of the photoimageable species. The change in the solubility of the photoimageable species is to enable the solvation of the photoimageable species within the pixels and the removal of a positive photoresist by a developer. In a negative photoresist the superacid will catalyze the cross-linking of the photoimageable species between pixels, and the developer that is subsequently applied will remove the portions of the negative photoresist that were not cross-linked. A post-exposure bake may be performed on the pixelated photoresist 420 to enhance the mobility and hence the diffusion of the photo-generated acid within the pixelated photoresist 420. The post-exposure bake may be performed at a temperature in the approximate range of 90° C. and 150° C. and for a time in the approximate range of 30 seconds and 90 seconds. The temperature and the time of the post-exposure bake are dependent on the chemistry of the pixelated photoresist 420. The developer may be applied after the post-exposure bake to remove the desired portions of the pixelated photoresist 420. The developer may be a basic aqueous solution.

Figure 4F:
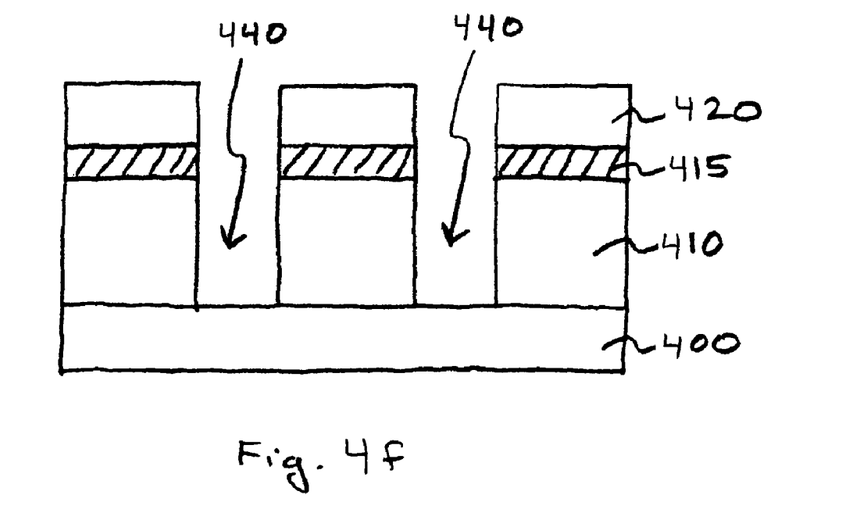
Figure 4G:
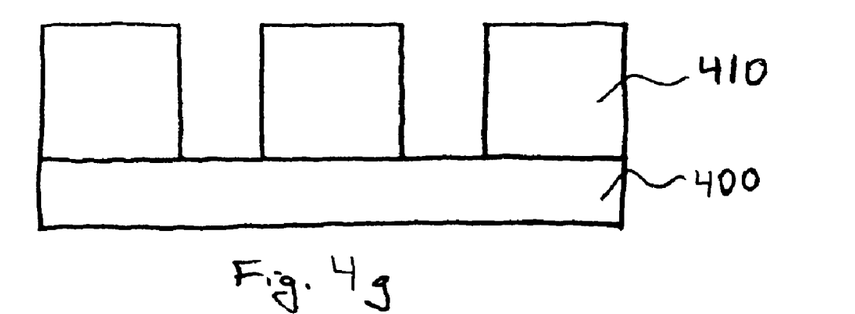

After the pixelated photoresist 420 is developed, vias 440 are etched through dielectric layer 410 down to substrate 400, as illustrated in FIG. 4f. Conventional process steps for etching through a dielectric layer may be used to etch the via, e.g., a conventional anisotropic dry oxide etch process. When silicon dioxide is used to form dielectric layer 410, the via may be etched using a medium density magnetically enhanced reactive ion etching system ("MERIE" system) using fluorocarbon chemistry, or using other typical dry etch chemistries as is known to those skilled in the art. When a polymer is used to form dielectric layer 410, a forming gas chemistry, e.g., one including nitrogen and either hydrogen or oxygen, may be used to etch the polymer, or using other typical dry etch chemistries as is known to those skilled in the art. After vias 440 are formed through dielectric layer 410, the pixelated photoresist 420 and the BARC 415 are removed as illustrated in FIG. 4g. The pixelated photoresist 420 and BARC 415 may be removed using a conventional ashing procedure.

Figure 4H:
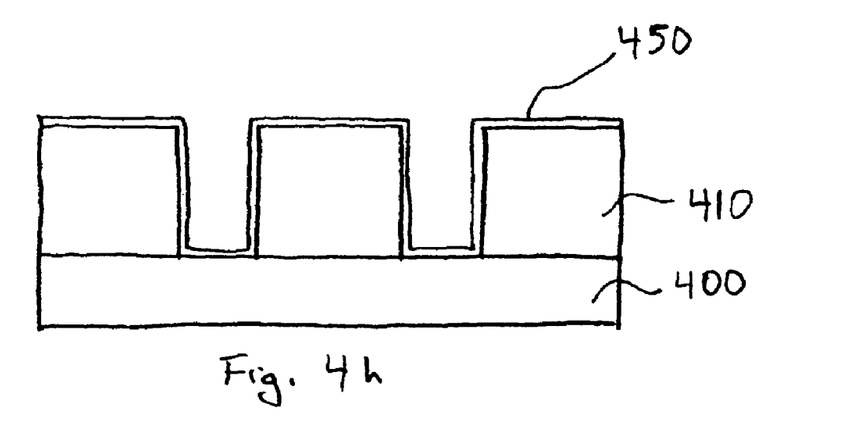

A barrier layer 450 is then formed over the vias 440 and the dielectric 410 as illustrated in FIG. 4h. The barrier layer 450 may comprise a refractory material, such as titanium nitride or tantalum nitride and may have a thickness in the approximate range of 100 and 500 angstroms. The barrier layer may be deposited by chemical vapor deposition (CVD), sputter deposition, or atomic layer deposition (ALD). The purpose of the barrier layer 450 is to prevent metals such as copper that migrate at temperatures used in semiconductor processing from migrating out of the vias and causing shorts. A metal layer 460 is then deposited into the vias 440. The metal layer may be copper, copper alloy, gold, or silver. In one particular embodiment copper is deposited to form the metal layer 460. Copper may be deposited by electroplating or electroless (catalytic) deposition that require first depositing a seed material in the vias 440. Suitable seed materials for the deposition of copper by electroplating or electroless deposition include copper and nickel. The barrier layer 450 may also serve as the seed layer.

Figure 4I:
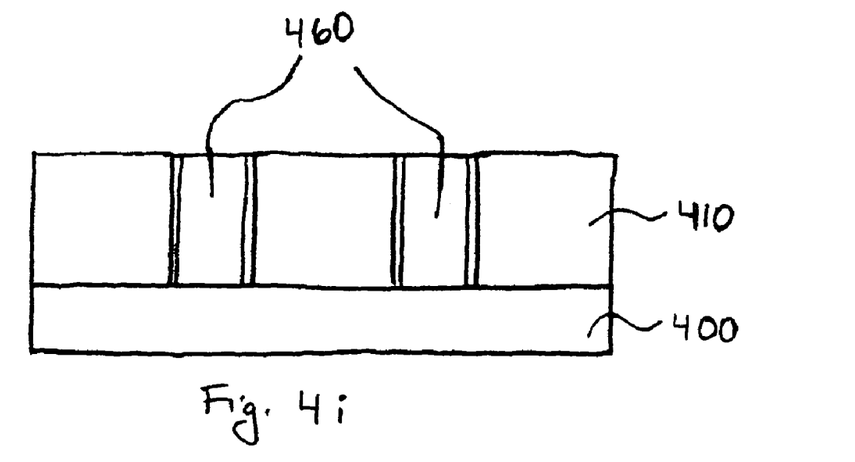

FIG. 4i illustrates the structure that results after filling vias 440 with a conductive material and planarizing, using a process such as chemical mechanical planarization (CMP). Although the embodiment illustrated in FIG. 5i illustrates only one dielectric layer 400 and vias 440, the process described above may be repeated to form additional conductive and insulating layers until the desired integrated circuit is produced.

Several embodiments of the invention have thus been described. However, those of ordinary skill in the art will recognize that the invention is not limited to the embodiments described, but can be practiced with modification and alteration within the scope and spirit of the appended claims that follow.

We claim:

1. A composition, comprising:
   a photoacid generator;
   a photoimageable species having a solubility switch; and
   a quencher, wherein the photo-acid generator, the photoimageable species having the solubility switch, and the quencher are in a deliberately engineered arrangement consisting of a chain with respect to one another to define a unit of the composition.

2. The composition of claim 1, wherein the deliberately engineered arrangement places the photo-acid generator in close proximity to the photoimageable species having the solubility switch and separates the quencher from the photoacid generator by the photoimageable species having the solubility switch.

3. The composition of claim 2, wherein the quencher surrounds a core formed of the photoimageable species surrounding the photoacid generator.

4. The composition of claim 2, wherein the solubility switch points in the direction of the photoacid generator.

5. The composition of claim 1, wherein the photoimageable species is the backbone of the chain.

6. The composition of claim 1, wherein the photoacid generator and the quencher are bound to the photoimageable species.

7. The composition of claim 1, wherein the photoimageable species are linked to one another by a linker containing a switch.

8. A composition, comprising:
   a plurality of pixels of the same size, wherein the pixels each comprise a photo-acid generator, a photoimageable species having a solubility switch, and a quencher in a deliberately engineered arrangement consisting of a chain.

9. The composition of claim 8, further comprising a solvent to solvate the plurality of pixels.

10. The composition of claim 8, further comprising additives to prevent a bulk phase of the plurality of pixels.

11. The composition of claim 8, wherein the composition further comprises a binding group to bind the pixel to a substrate.

12. A photoresist, comprising:
   at least one photoacid generator selected from the group consisting of diaryliodonium, triaryliodonium, an arylsulfonium, a perflate, a nonaflate, or a hydrocarbon sulfonate;
   at least one quencher selected from the group consisting of tetrabutylammonium hydroxide, collidine, analine, or dimethylaminopyridine; and
   a photoimageable species, wherein the photoacid generator, the quencher and the photoimageable species are in a deliberately engineered arrangement with respect to one another to define a unit of the composition and wherein the photoacid generator and the photoimageable species form a micelle such that the micelle is arranged to place one of the photoacid generator and the quencher in a center of the micelle and one of the photoacid generator and the quencher on a periphery of the micelle wherein the photoacid generator is separated from the quencher by the photoimageable species.

13. The photoresist of claim 12, further comprising a solubility switch on the photoimageable species.

14. The photoresist of claim 12, further comprising a solubility switch placed in between the photoacid generator and the photoimageable species.

15. The photoresist of claim 12, wherein the photoacid generator, the photoimageable species, and the quencher are bound by one of ionic forces, covalent bonds, hydrogen bonds, or hydrophobic forces.

16. The photoresist of claim 12, wherein the micelle further comprises a binding group to bind the micelle to a substrate.

17. The photoresist of claim 12, wherein the micelle comprises a hydrophilic exterior and a hydrophobic interior.

18. The photoresist of claim 12, wherein the micelle is a reverse micelle comprising a hydrophobic exterior and a hydrophilic interior.

19. The photoresist of claim 17, wherein the micelle is dispersed within an aqueous solution.

20. A method, comprising:
combining a plurality of components of a photoresist to self assemble the plurality of components into a plurality of pixels within a pixelated photoresist, wherein the plurality of components comprises a photoacid generator selected from the group consisting of diaryliodonium, triaryliodonium, an arylsulfonium, a perflate, a nonaflate, or a hydrocarbon sulfonate, a photoimageable species having a solubility switch, and a quencher selected from the group consisting of tetrabutylammonium hydroxide, collidine, analine, or dimethylaminopyridine in a deliberately engineered arrangement; and
applying the pixelated photoresist to a substrate.

21. The method of claim 20, wherein combining the plurality of components of the photoresist forms a plurality of pixels having a micellar structure.

22. The method of claim 20, wherein combining the plurality of components of the photoresist forms a plurality of pixels formed as bulky clusters.

23. The method of claim 20, further comprising self-assembling the plurality of pixels to the surface of the substrate.

24. A method comprising:
applying a pixelated photoresist to a substrate wherein the pixelated photoresist comprises a plurality of pixels, each pixel comprising a photoacid generator selected from the group consisting of diaryliodonium, triaryliodonium, an arylsulfonium, a perflate, a nonaflate, or a hydrocarbon sulfonate, a photoimageable species having a solubility switch and a quencher selected from the group consisting of tetrabutylammonium hydroxide, collidine, analine, or dimethylaminopyridine in a deliberately engineered arrangement;
patterning the photoresist by irradiating the photoresist; and
etching the substrate.

25. The method of claim 24, wherein applying a photoresist to the substrate comprises applying a chemically amplified photoresist to the substrate.

26. The method of claim 24, wherein patterning the photoresist by irradiating the photoresist comprises exposing the photoresist to light having a wavelength of 193 nm.

27. The method of claim 24, wherein patterning the photoresist by irradiating the photoresist comprises exposing the photoresist to light having a wavelength in the extreme ultraviolet region of the spectrum.

28. The method of claim 27, wherein the wavelength in the extreme ultraviolet region of the spectrum is 13.5 nm.

29. The composition of claim 1, wherein (a) the photoimageable species including the solubility switch has at least one first type of side chain and (b) the photoacid generator is associated with the first type of side chain and spatially proximal to the photoimageable species.

30. The composition of claim 29, further comprising at least one second type of side chain on the photoimageable species wherein the quencher is associated with the second type of side chain and spatially distal from the photoimageable species.

31. The composition of claim 29, wherein the photoimageable species further comprises a first polymer and a linker polymer.

32. The composition of claim 31, further comprising a second polymer covalently bonded to the linker and having at least one second type of side chain, wherein the quencher is associated with a second type of side chain and spatially distal from the second polymer.

33. The composition of claim 30, wherein the photoimageable species including the solubility switch, the photoacid generator and the quencher form a unit.

34. The composition of claim 33, wherein the units are identical.

35. The composition of claim 34, wherein the composition has a property such that upon exposure to an imaging source, a chain of units are covalently bonded by linker polymers.

36. The composition of claim 32, wherein the photoimageable species including the solubility switch, the photoacid generator, the quencher and the second polymer form a unit.

37. The composition of claim 36, wherein the units are identical.

38. The composition of claim 37, wherein the composition has a property such that upon exposure to an imaging source, a chain of units are covalently bonded by linker polymers.

39. The composition of claim 1, wherein the photoimageable species comprises a first polymer and a linker polymer, wherein the solubility switch is associated with the linker polymer.

40. The composition of claim 39, wherein the first polymer is selected from the group consisting of a carborane, a steroid, an alicyclic hydrocarbone, polyhedral oligosilsequioxane, colloidal silica, a micelle and a carbon moiety having a diameter less than 2 nm.

41. The composition of claim 40, wherein (a) the photoacid generator is associated with the linker polymer by at least one first type of side chain and spatially proximal to the linker polymer and (b) the quencher is associated with the first polymer by at least one second type of side chain and spatially distal from the first polymer.

42. The composition of claim 41, wherein the photoimageable species, the photoacid generator and the quencher form a unit.

43. The composition of claim 42, wherein the composition has a property such that upon exposure to an imaging source, a multitude of units are covalently linked by the linker polymer.

44. The composition of claim 43, wherein the units are adapted to form a cluster such that each photoacid generator resides in a center of the cluster, each first polymer resides spatially outward from the photoacid generators and each quencher resides spatially outward from each first polymer.

45. The composition of claim 1, wherein the photoimageable species is covalently linked to the solubility switch and the solubility switch is covalently linked to the photoacid generator.

* * * * *